United States Patent
Kim et al.

(10) Patent No.: US 10,170,534 B1
(45) Date of Patent: Jan. 1, 2019

(54) DISPLAY DEVICE

(71) Applicant: SAMSUNG DISPLAY CO., LTD., Yongin-si, Gyeonggi-do (KR)

(72) Inventors: Dongwook Kim, Yongin-si (KR); Wonkyu Kwak, Yongin-si (KR); Sunja Kwon, Yongin-si (KR); Seho Kim, Yongin-si (KR); Hansung Bae, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/883,610

(22) Filed: Jan. 30, 2018

(30) Foreign Application Priority Data

Sep. 15, 2017 (KR) .......................... 10-2017-0118845

(51) Int. Cl.
| | |
|---|---|
| *H01L 27/32* | (2006.01) |
| *G09G 3/3283* | (2016.01) |
| *H01L 27/12* | (2006.01) |
| *H01L 51/52* | (2006.01) |
| *G09G 3/3216* | (2016.01) |

(52) U.S. Cl.
CPC ...... *H01L 27/3279* (2013.01); *H01L 27/3223* (2013.01); *H01L 27/3258* (2013.01); *H01L 27/3262* (2013.01); *G09G 3/3216* (2013.01); *G09G 3/3283* (2013.01); *G09G 2300/0408* (2013.01); *G09G 2300/0426* (2013.01); *G09G 2300/0842* (2013.01); *G09G 2330/021* (2013.01); *H01L 27/1244* (2013.01); *H01L 51/5237* (2013.01); *H01L 2251/5392* (2013.01)

(58) Field of Classification Search
CPC ............ H01L 27/3262; H01L 27/3279; H01L 27/3258; H01L 27/3276; H01L 27/3297; H01L 27/3223
See application file for complete search history.

(56) References Cited

U.S. PATENT DOCUMENTS

| | | | |
|---|---|---|---|
| 8,294,702 B2 | 10/2012 | Tanikame | |
| 9,151,998 B2* | 10/2015 | Jung | ................. G02F 1/133788 |
| 9,207,494 B2* | 12/2015 | Lee | ........................ G02F 1/1337 |
| 9,391,296 B2* | 7/2016 | Park | .................... H01L 51/5253 |
| 9,415,576 B2* | 8/2016 | Seo | ..................... B32B 37/1284 |
| 9,434,144 B2* | 9/2016 | Kim | .................... B32B 37/1292 |
| 2005/0155704 A1* | 7/2005 | Yokajty | ............... H01L 51/5246 |
| | | | 156/295 |

(Continued)

FOREIGN PATENT DOCUMENTS

KR  1020090068144 A  6/2009

*Primary Examiner* — Earl Taylor
(74) *Attorney, Agent, or Firm* — Cantor Colburn LLP

(57) ABSTRACT

A display device includes: a substrate; a plurality of display elements in a display area of the substrate, where each of the plurality of display elements includes a pixel electrode, an opposite electrode, and an intermediate layer between the pixel electrode and the opposite electrode; a drive circuit on an outer side of the display area and including a thin film transistor; a first insulating layer on the drive circuit; a first power supply line layer on the first insulating layer and overlapping the drive circuit; a second insulating layer on the first power supply line layer; and a connection electrode layer on the second insulating layer, where the connection electrode layer electrically connects the first power supply line layer to the opposite electrode.

20 Claims, 8 Drawing Sheets

(56) References Cited

U.S. PATENT DOCUMENTS

| | | | |
|---|---|---|---|
| 2011/0151612 A1* | 6/2011 | Dings | H01L 27/1214 438/69 |
| 2013/0342889 A1* | 12/2013 | Kim | G02B 26/005 359/290 |
| 2015/0060806 A1* | 3/2015 | Park | H01L 51/5253 257/40 |
| 2016/0020427 A1* | 1/2016 | Cho | H01L 51/5256 257/40 |
| 2016/0035996 A1* | 2/2016 | Sun | H01L 21/77 257/40 |
| 2017/0033312 A1* | 2/2017 | Kim | H01L 51/5253 |
| 2017/0125734 A1* | 5/2017 | Lee | H01L 27/3246 |

* cited by examiner

DISPLAY DEVICE

This application claims priority to Korean Patent Application No. 10-2017-0118845, filed on Sep. 15, 2017, and all the benefits accruing therefrom under 35 U.S.C. § 119, the content of which in its entirety is herein incorporated by reference.

BACKGROUND

1. Field

One or more embodiments relate to a display device.

2. Description of the Related Art

An organic light-emitting display device is self-emissive that operates without using separate light sources, such that the organic light-emitting display device may operate at a low voltage and may include lightweight thin films. Such an organic light-emitting display device has been on the spotlight as one of next-generation display devices due to high-quality characteristic thereof such as wide viewing angle, high contrast ratio, and fast response rate.

SUMMARY

One or more embodiments include a high-quality display device.

According to one or more embodiments, a display device includes: a substrate; a plurality of display elements in a display area of the substrate, where each of the plurality of display elements includes a pixel electrode, an opposite electrode, and an intermediate layer between the pixel electrode and the opposite electrode; a drive circuit on an outer side of the display area and including a thin film transistor; a first insulating layer on the drive circuit; a first power supply line layer on the first insulating layer and overlapping the drive circuit; a second insulating layer on the first power supply line layer; and a connection electrode layer on the second insulating layer, where the connection electrode layer electrically connects the first power supply line layer to the opposite electrode.

In an embodiment, a plurality of first holes may be defined in the first power supply line layer.

In an embodiment, a contact hole may be defined in the second insulating layer, and a center of the contact hole may be offset from a center of each of the plurality of first holes.

In an embodiment, the connection electrode layer may contact the first power supply line layer through the contact hole.

In an embodiment, a plurality of second holes may be defined in the connection electrode layer.

In an embodiment, at least one of the plurality of second holes may overlap at least one of the plurality of first holes.

In an embodiment, the display device may further include a plurality of protrusions covering the plurality of second holes, respectively, where the plurality of protrusions may include an insulating material.

In an embodiment, the plurality of protrusions may be spaced apart from one another.

In an embodiment, a first valley hole may be defined in the first insulating layer.

In an embodiment, the first insulating layer may include an organic insulating material.

In an embodiment, a portion of the first power supply line layer may contact, through the first valley hole, an insulating layer under the first insulating layer.

In an embodiment, the insulating layer may include an inorganic material.

In an embodiment, a second valley hole corresponding to the first valley hole may be defined in the second insulating layer, and the connection electrode layer may contact the first power supply line layer through the second valley hole.

In an embodiment, the second insulating layer may include an organic insulating material.

In an embodiment, the display device may further include a second power supply line layer on the outer side of the display area and connected to the first power supply line layer.

In an embodiment, the first power supply line layer and the second power supply line layer may partially surround the display area.

In an embodiment, a contact area between the first power supply line layer and the second power supply line layer may extend to partially surround the display area.

In an embodiment, the first power supply line layer may partially surround the display area, and the second power supply line layer may contact the first power supply line layer on the outer side of the display area.

In an embodiment, the second power supply line layer may be under the first insulating layer, and the first power supply line layer may contact the second power supply line layer through an opening or a contact hole, which is defined in the first insulating layer.

In an embodiment, a side surface of the second power supply line layer may be covered by an inorganic insulating layer.

BRIEF DESCRIPTION OF THE DRAWINGS

These and/or other features of the invention will become apparent and more readily appreciated from the following description of the embodiments, taken in conjunction with the accompanying drawings, in which.

DETAILED DESCRIPTION

Figure 1:
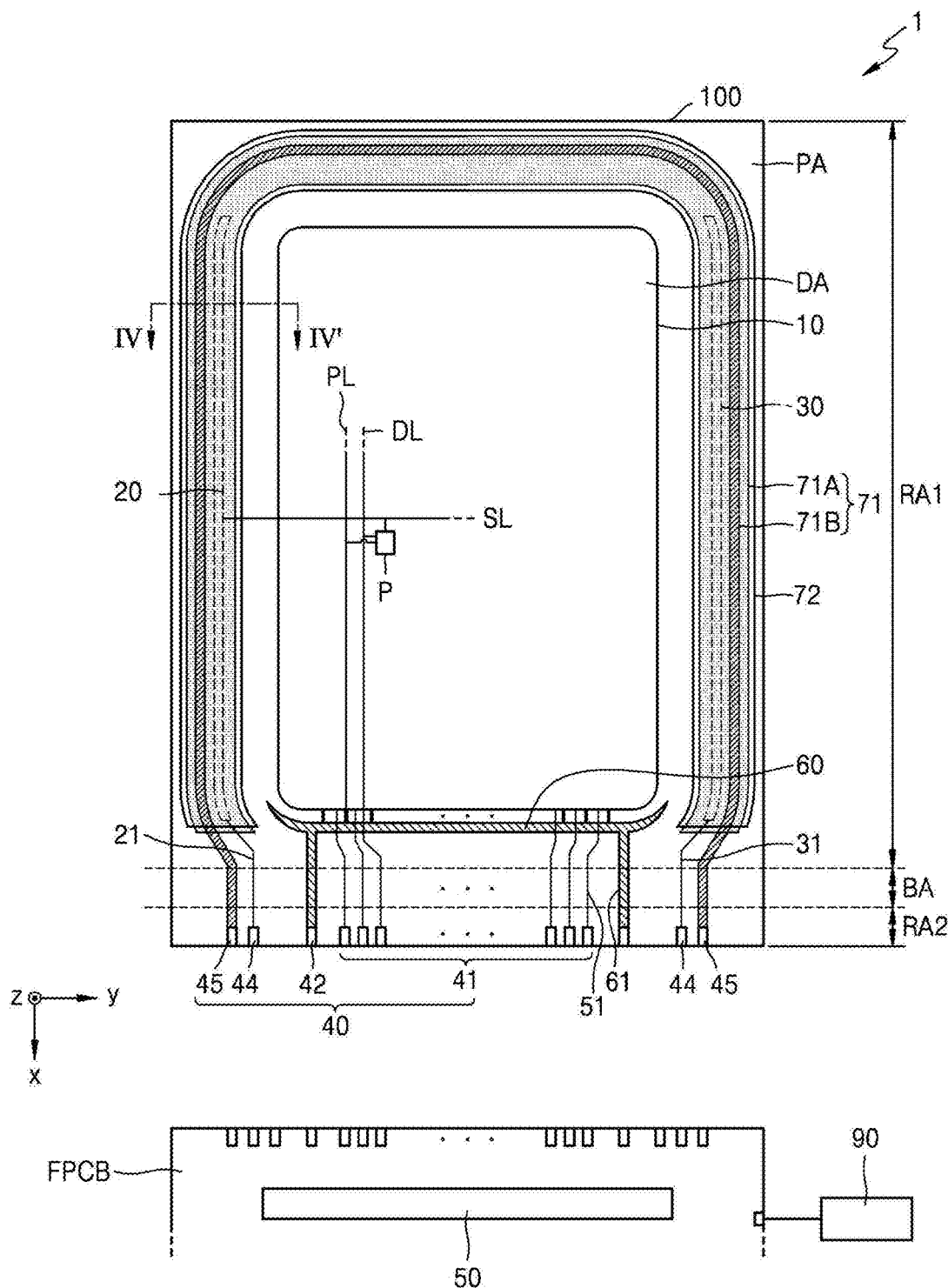
FIG. 1 is a plan view of a display device according to an embodiment.

The invention now will be described more fully hereinafter with reference to the accompanying drawings, in which various embodiments are shown. This invention may, however, be embodied in many different forms, and should not be construed as limited to the embodiments set forth herein.

Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present. It will be understood that when an element, region or layer is referred to as being "connected to" or as "contacting" another element, region or layer, the element, region or layer can be directly connected to or contact another element, region or layer, or intervening elements, regions or layers. For example, when an element, region or layer is referred to as being electrically connected to another element, region or layer, the element, region or layer can be directly electrically connected to the other element, region or layer or can be indirectly electrically connected thereto with intervening elements, regions or layers therebetween.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

An x-axis, a y-axis and a z-axis are not limited to three axes of a rectangular coordinate system and may be interpreted in a broader sense. For example, the x-axis, the y-axis, and the z-axis may be perpendicular to one another or may be different directions that are not perpendicular to one another.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

A display device displays an image, and examples of the display device may include a liquid crystal display ("LCD") device, an electrophoretic display device, an organic light-emitting display device, an inorganic light-emitting display device, a field emission display device, a surface-conduction electron-emitter display device, a plasma display device, a cathode ray display device, and the like.

Hereinafter, embodiments of a display device will be described in detail with reference to the accompanying drawings. For convenience of description, embodiments of a display device, where the display device is an organic light-emitting display device will be described. However, the display device of the disclosure is not limited thereto, and a variety of display devices may be used.

Figure 2:
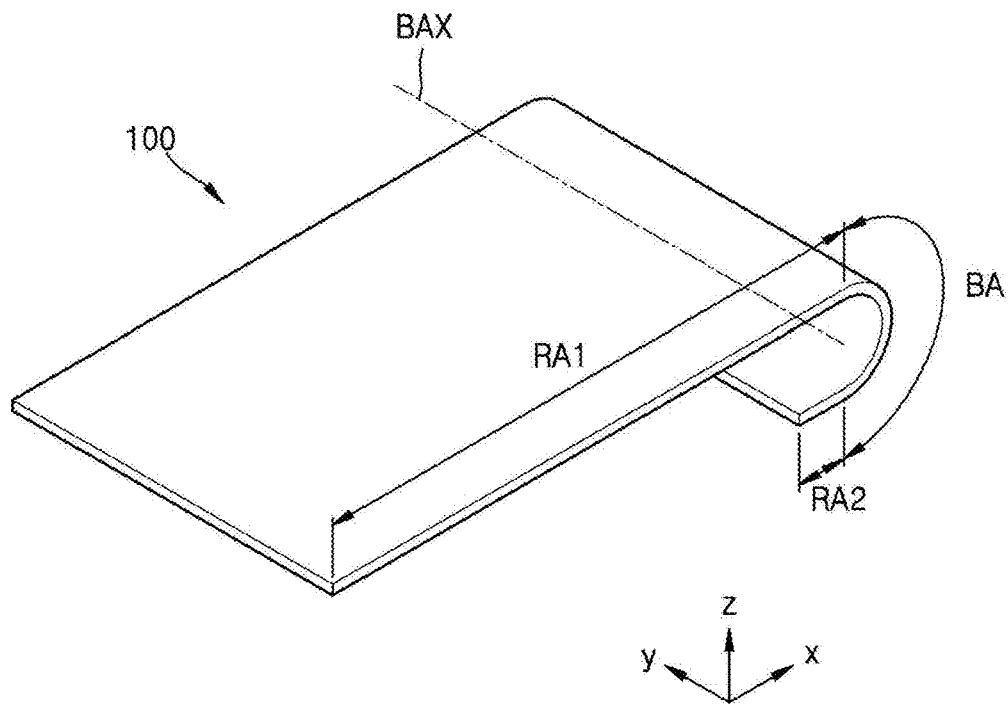
FIG. 2 is a schematic perspective view of a portion of a display device, according to an embodiment.

FIG. 1 is a plan view of a display device 1 according to an embodiment. FIG. 2 is a schematic perspective view of a portion of the display device 1, according to an embodiment.

Referring to FIG. 1, an embodiment of the display device 1 includes a substrate 100, and a display 10 disposed on the substrate 100. The display 10 includes pixels P connected to a scan line SL extending in a y direction and a data line DL extending in an x direction crossing the y direction.

Each pixel P may emit, for example, a red light, a green light, or a blue light. Alternatively, each pixel P may emit a red light, a green light, a blue light, or a white light. The pixel P may include a display element, and the display element may include an organic light-emitting diode. The display 10 provides an image through light emitted from the pixels P, and defines a display area DA. Herein, the pixel P indicates a sub-pixel that emits one of a red light, a green light, and a blue light, or a white light as described above.

A peripheral area PA is outside the display area DA. In one embodiment, for example, the peripheral area PA may surround the display area DA. The peripheral area PA is an area where the pixels P are not arranged, and corresponds to a non-display area where an image is not provided.

The peripheral area PA may include a bending area BA. The bending area BA may have a predetermined width in the x direction and may extend in the y direction. The substrate 100 may be divided, by the bending area BA, into a first area RA1 including the display area DA and a second area RA2 opposite to the first area RA1. In such an embodiment, the bending area BA is between the first area RA1 and the second area RA2. The first area RA1 may include the display area DA and a portion of the peripheral area PA, and the second area RA2 may only include a portion of the peripheral area PA.

The display device 1 may be bent or curved with respect to the center of the bending area BA. In an embodiment, as illustrated in FIG. 2, the substrate 100 of the display device 1 may be partially bent. In one embodiment, for example, the substrate 100 may be bent with respect to a bending axis BAX extending in the y direction and thus may have a shape that is bent similar to the substrate 100 of the display device 1. The substrate 100 may include various flexible or bendable materials (e.g., polymer resin). For convenience of illustration, FIG. 2 illustrates that the substrate 100, not the entire display device 1, is bent.

In the peripheral area PA, a drive circuit, e.g., first and second scan drive circuits 20 and 30, a terminal portion 40, a driving power supply line 60, and a common power supply line 71 may be disposed.

The first and second scan drive circuits 20 and 30 may be in the peripheral area PA of the substrate 100 and may generate scan signals, thereby transmitting the scan signals to the pixels P through the scan line SL. In one embodiment, for example, the first scan drive circuit 20 may be on the left side of the display 10, and the second scan drive circuit 30 may be on the right side of the display 10. However, one or more embodiments of the disclosure are not limited thereto. According to an alternative embodiment, the display device may include a single scan drive circuit.

The terminal portion 40 is on one end of the substrate 100 and includes terminals 41, 42, 44, and 45. The terminal portion 40 may not be covered by an insulating layer and may be electrically connected to a flexible printed circuit board FPCB.

The flexible printed circuit board FPCB may electrically connect a controller 90 to the terminal portion 40, and a signal or power from the controller 90 may be transmitted through lines 21, 31, 51 and 61 and the common power supply line 71, which are connected to the terminal portion 40.

The controller 90 may receive a vertical synchronization signal, a horizontal synchronization signal, and a clock signal and generate control signals for controlling operation of the first and second scan drive circuits 20 and 30. The generated control signals may be respectively transmitted to the first and second scan drive circuits 20 and 30 through the terminal 44 and the lines 21 and 31, which are connected to the flexible printed circuit board FPCB, and scan signals from the first and second scan drive circuits 20 and 30 may be respectively transmitted to the pixels P though the scan line SL. The controller 90 may supply driving voltage or power ELVDD and common voltage or power ELVSS to the driving power supply line 60 and the common power supply line 71, respectively, through the terminals 42 and 45 and the line 61 and a second power supply line layer 71B. The driving voltage ELVDD may be supplied to each pixel P through a driving voltage line PL, and the common voltage ELVSS may be supplied to an opposite electrode of the pixel P.

A data drive circuit 50 may be on the flexible printed circuit board FPCB. The data drive circuit 50 may provide a data signal to each pixel P. The data signal from the data drive circuit 50 is provided to each pixel P through the line 51 connected to the terminal 41 and the data line DL connected to the line 51. FIG. 1 illustrates a chip-on-film ("COP") structure in which the data drive circuit 50 is on the flexible printed circuit board FPCB. However, one or more embodiments of the disclosure are not limited thereto. In an alternative embodiment, the data drive circuit 50 may be in the peripheral area PA of the substrate 100.

The driving power supply line 60 may be in the peripheral area PA. In one embodiment, for example, the driving power supply line 60 may be between the terminal portion 40 and one side of the display 10 which is adjacent to the terminal portion 40. The driving voltage ELVDD supplied through the line 61 connected to the terminal 41 may be supplied to each pixel P through the driving voltage line PL.

The common power supply line 71 may be in the peripheral area PA and may supply the common voltage ELVSS to the opposite electrode (e.g., a cathode) of the organic light-emitting diode of the pixel P.

The common power supply line 71 may include a first power supply line layer 71A and a second power supply line layer 71B.

The first power supply line layer 71A may extend to partially surround the display 10 along an edge thereof. In one embodiment, for example, the first power supply line layer 71A may be loop-shaped with one open side corresponding to a side of the display 10, which is adjacent to the terminal portion 40, and may extend along edges of the substrate 100 except for the terminal portion 40. In an embodiment, the first power supply line layer 71A may be in the first area RA1 of the peripheral area PA where the display 10 is disposed.

The second power supply line layer 71B may overlap the first power supply line layer 71A and may be connected to the first power supply line layer 71A. In one embodiment, for example, the second power supply line layer 71B may be loop-shaped with one open side corresponding to the side of the display 10, which is adjacent to the terminal portion 40, and may extend along the edges of the substrate 100 to overlap the first power supply line layer 71A. A portion of the second power supply line layer 71B, which overlaps the first power supply line layer 71A, may be an area, for example, a contact area, where the second power supply line layer 71B is electrically connected to the first power supply line layer 71A.

The second power supply line layer 71B may extend to an end of the substrate 100. In one embodiment, for example, the second power supply line layer 71B overlaps the first power supply line layer 71A in the first area RA1, and ends of the second power supply line layer 71B may extend to the second area RA2 across the bending area BA. In an embodiment where the display device 1 includes the bending area BA, the second power supply line layer 71B may include a bridge line layer passing the bending area BA. In one embodiment, for example, the second power supply line layer 71B may include line layers respectively corresponding to the first area RA1 and the second area RA2, and the line layer corresponding to the first area RA1 and the line layer corresponding to the second area RA2 may be electrically connected to each other by the bridge line layer passing the bending area BA.

FIGS. 1 and 2 illustrate an embodiment where the display device 1 includes the bending area BA, but one or more embodiments are not limited thereto. In an alternative embodiment, the display device 1 may not include the bending area BA, and in such an embodiment, the second power supply line layer 71B may not include the bridge line layer.

A connection electrode layer 72 may overlap the first power supply line layer 71A and may extend to partially overlap the display 10 along the first power supply line layer 71A. A portion of the connection electrode layer 72, which overlaps the first power supply line layer 71A, may correspond to an area, for example, a contact area, where the connection electrode layer 72 is electrically connected to the first power supply line layer 71A.

The connection electrode layer 72 electrically connects the common power supply line 71 to the opposite electrode (e.g., the cathode) of the organic light-emitting diode of the pixel P.

Referring to FIG. 1, a width of the connection electrode layer 72 is greater than that of the first power supply line layer 71A, but one or more embodiments are not limited thereto. In an alternative embodiment, the width of the connection electrode layer 72 is substantially the same as or less than that of the first power supply line layer 71A.

Figure 3:
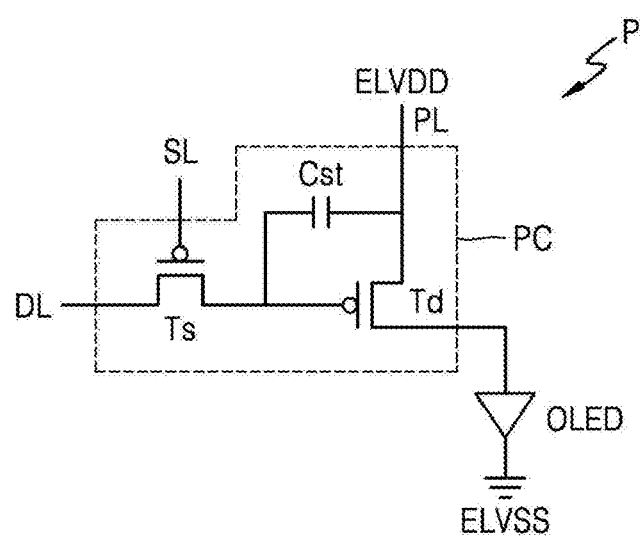
FIG. 3 is an equivalent circuit diagram of a pixel of a display device, according to an embodiment.

FIG. 3 is an equivalent circuit diagram of a pixel P of a display device, according to an embodiment.

Referring to FIG. 3, the pixel P may include a pixel circuit PC connected to the scan line SL and the data line DL, and the organic light-emitting diode OLED connected to the pixel circuit PC.

The pixel circuit PC includes a driving thin film transistor Td, a switching thin film transistor Ts, and a storage capacitor Cst. The switching thin film transistor Ts is connected to the scan line SL and the data line DL and transmits, to the driving thin film transistor Td, the data signal input through the data line DL in response to the scan signal input through the scan line SL.

The storage capacitor Cst is connected to the switching thin film transistor Ts and the driving voltage line PL, and stores a voltage corresponding to a difference between a voltage from the switching thin film transistor Ts and a driving voltage ELVDD supplied to the driving voltage line PL.

The driving thin film transistor Td may be connected to the driving voltage line PL and the storage capacitor Cst, and may control a driving current corresponding to a value of the voltage stored in the storage capacitor Cst and flowing in the organic light-emitting diode OLED from the driving voltage line PL. The organic light-emitting diode OLED may emit light having a brightness corresponding to the driving current. The organic light-emitting diode OLED may emit, for example, a red light, a green light, a blue light, or a white light.

FIG. 3 illustrates an embodiment where the pixel P includes two thin film transistors and one storage capacitor, but one or more embodiments of the disclosure are not limited thereto. A design of the pixel circuit PC may be variously modified. In one alternative embodiment, for example, the pixel P may include three or more thin film transistors or two or more storage capacitors.

Figure 4:
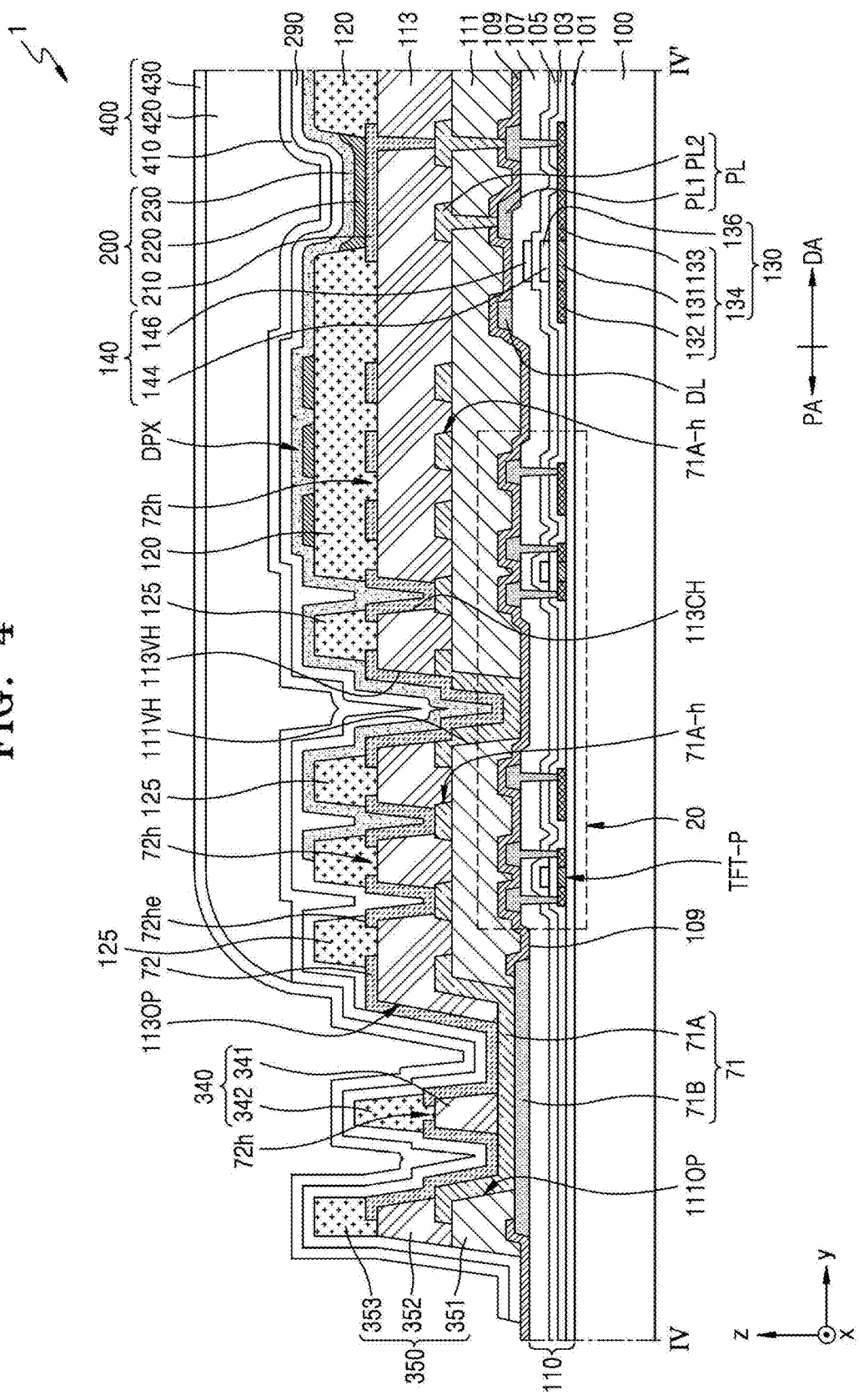
FIG. 4 is a cross-sectional view taken along line IV-IV' of FIG. 1.
Figure 5A:
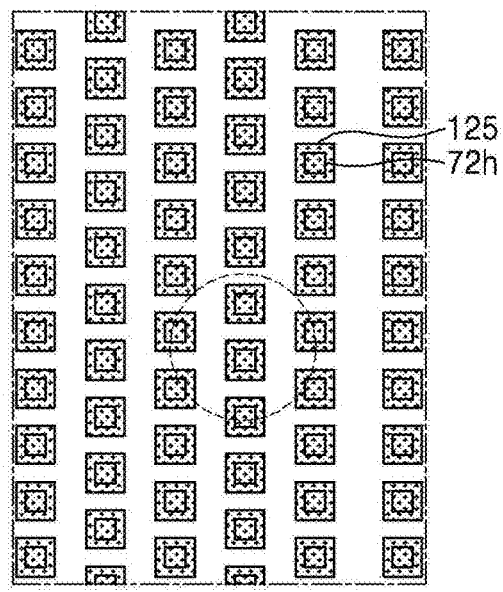
FIG. 5A is a top plan view of protrusions of FIG. 4.
Figure 5B:
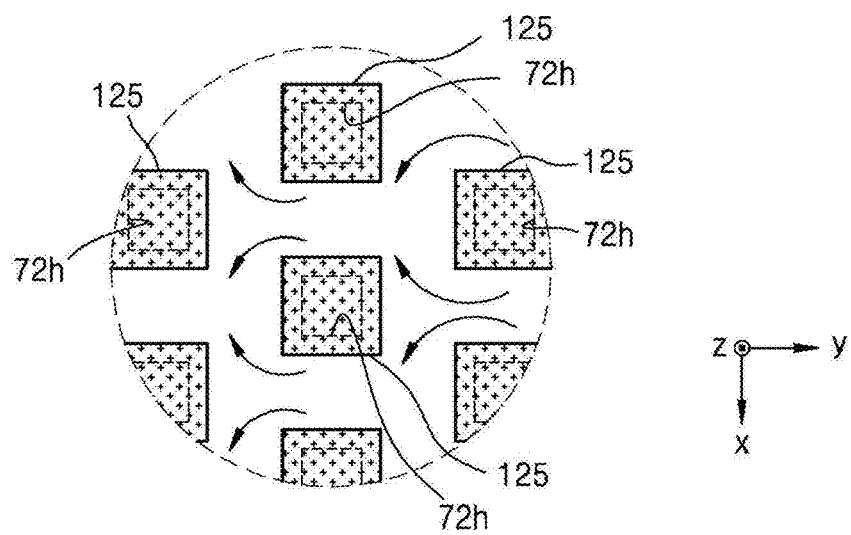
FIG. 5B is an enlarged view of the encircled portion in FIG. 5A.

FIG. 4 is a cross-sectional view taken along line IV-IV' of FIG. 1. FIG. 5A is a top plan view of protrusions of FIG. 4. FIG. 5B is an enlarged view of the encircled portion in FIG. 5A For convenience of illustration, FIG. 5A illustrates only protrusions 125 of the display device 1.

In the display area DA of FIG. 4, a buffer layer 101 may be on the substrate 100. The substrate 100 may include a polymer (or plastic), for example, at least one of polyethylene terephthalate ("PET"), polyethylene naphthalate ("PEN"), or polyimide. Although not illustrated, the substrate 100 may have a multi-layer structure including inorganic barrier layers between plastic layers including polyimide, for example.

The buffer layer 101 may effectively prevent impurities or moisture from penetrating into the substrate 100. In one embodiment, for example, the buffer layer 101 may include inorganic materials such as silicon oxide (SiOx), silicon nitride (SiNx) and/or silicon oxynitride (SiON), and may have a single-layer structure or a multi-layer structure.

In such an embodiment, a thin film transistor 130, a storage capacitor 140, and an organic light-emitting diode 200 that is a display element electrically connected to the thin film transistor 130 and the storage capacitor 140, may be disposed on the substrate 100 in the display area DA. The thin film transistor 130 of FIG. 4 may correspond to any one of the thin film transistors, for example, the driving thin film transistor Td, which is included in the pixel circuit PC described above with reference to FIG. 3. The storage capacitor 140 of FIG. 4 may correspond to the storage capacitor Cst that has been described above with reference to FIG. 3.

The thin film transistor 130 may include a semiconductor layer 134 and a gate electrode 136. The semiconductor layer 134 may include, for example, polysilicon. The semiconductor layer 134 may include a channel area 131 overlapping the gate electrode 136 and source and drain areas 132 and 133, which are respectively on both sides of the channel area 131 and include impurities having a higher concentration than impurities in the channel area 131. Here, the impurities may include N-type impurities and P-type impurities. The source area 132 and the drain area 133 may be understood as a source electrode and a drain electrode of the thin film transistor 130, respectively.

In an embodiment, the semiconductor layer 134 includes polysilicon, but one or more embodiments of the disclosure are not limited thereto. In an alternative embodiment, the semiconductor layer 134 may include amorphous silicon or organic semiconductor materials.

A gate insulating layer 103 may be between the semiconductor layer 134 and the gate electrode 136. The gate insulating layer 103 may be an inorganic layer including SiON, SiOx, and/or SiNx, and the inorganic layer may have a single-layer structure or a multi-layer structure.

The storage capacitor 140 includes first and second storage condenser plates 144 and 146 overlapping each other in a thickness direction of the substrate 100 or in a z direction. A first interlayer insulating layer 105 may be between the first and second storage condenser plates 144 and 146. The first interlayer insulating layer 105 may have a certain permittivity, may be an inorganic layer including SiON, SiOx, and/or SiNx, and may have a single-layer structure or a multi-layer structure. FIG. 4 illustrates an embodiment where the storage capacitor 140 overlaps the thin film transistor 130 and the first storage condenser plate 144 corresponds to the gate electrode 136 of the thin film transistor 130. However, one or more embodiments of the disclosure are not limited thereto. In an alternative embodiment, the storage capacitor 140 may not overlap the thin film transistor 130, and the first storage condenser plate 144 may be spaced apart from the gate electrode 136 of the thin film transistor 130.

The storage capacitor 140 may be covered by a second interlayer insulating layer 107. The second interlayer insulating layer 107 may be an inorganic layer including SiON, SiOx, and/or SiNx and may have a single-layer structure or a multi-layer structure.

The driving voltage line PL may include a first driving voltage line PL1 and a second driving voltage line PL2. The first driving voltage line PL1 may include the same material as the data line DL. In one embodiment, for example, the first driving voltage line PL1 and the data line DL may each have a single-layer structure or a multi-layer structure including aluminum (Al), copper (Cu), titanium (Ti), etc. According to an embodiment, the first driving voltage line PL1 and the data line DL may each have a multi-layer structure including Ti/Al/Ti.

The second driving voltage line PL2 may be above the first driving voltage line PL1 with a first insulating layer 111 therebetween, and may be electrically connected to the first driving voltage line PL1 though a contact hole defined in the first insulating layer 111. The second driving voltage line PL2 may have a single-layer structure or a multi-layer structure including Al, Cu, Ti, etc. In an embodiment, the second driving voltage line PL2 may have a multi-layer structure including Ti/Al/Ti. The first insulating layer 111 (hereinafter, referred to as the 'first organic insulating layer') may include an organic insulating layer, and the organic insulating layer may include at least one of an imide-based polymer, a general-purpose polymer such as polymethylmethacrylate ("PMMA") or polystyrene ("PS"), polymer derivatives having a phenol-based group, an acryl-based polymer, an aryl ether-based polymer, an amide-based polymer, a fluorine-based polymer, a p-xylene-based polymer, a vinyl alcohol-based polymer, and/or a combination thereof. In an embodiment, the first organic insulating layer 111 may include a polyimide.

The driving voltage line PL supplies uniform electrical signals, that is, the driving voltage ELVDD, to the pixels. It is desired to prevent voltage drop, etc. in the driving voltage line PL to realize a display device providing a high-quality image. According to an embodiment, since the driving voltage line PL may include the first driving voltage line PL1 and the second driving voltage line PL2, which are electrically connected to each other, and thus may effectively prevent resistance in the driving voltage line PL, although an area of the pixel P decreases to realize a high-resolution display device. Accordingly, in such an embodiment, voltage drop that may be caused by the resistance in the driving voltage line PL may be effectively prevented or substantially reduced.

The driving voltage line PL is covered by a second insulating layer 113 (hereinafter, referred to as the 'second organic insulating layer'), and the second organic insulating layer 113 may include at least one of an imide-based polymer, a general-purpose polymer such as PMMA or PS, polymer derivatives having a phenol-based group, an acryl-based polymer, an aryl ether-based polymer, an amide-based polymer, a fluorine-based polymer, a p-xylene based polymer, a vinyl alcohol-based polymer, and/or a combination thereof. In an embodiment, the second organic insulating layer 113 may include polyimide.

A pixel electrode 210 is on the second organic insulating layer 113. A pixel-defining layer 120 may be on the pixel electrode 210 and may define a pixel with an opening defined therein to correspond to each sub-pixel, that is, an opening exposing at least a central portion of the pixel electrode 210. In such an embodiment, the pixel-defining layer 120 may increase a distance between an edge of the pixel electrode 210 and an opposite electrode 230, and thus may effectively prevent arcs, etc. from being generated therebetween. The pixel-defining layer 120 may include an organic material such as polyimide or hexamethyldisiloxane ("HMDSO").

An intermediate layer 220 may include a low-molecular or high-molecular weight material. In an embodiment, where the intermediate layer 220 includes a low-molecular weight material, the intermediate layer 220 may have a single-layer or multi-layer structure including a hole injection layer ("HIL"), a hole transport layer ("HTL"), an emission layer ("EML") an electron transport layer ("ETL"), an electron injection layer ("EIL"), etc., and may include at least one of various organic materials including copper phthalocyanine ("CuPc"), N,N'-Di(naphthalene-1-yl)-N,N'-diphenyl-benzidine ("NPB"), tris-8-hydroxyquinoline aluminum ("Alq3"), and/or the like. Such layers may be formed by using a vacuum deposition method.

In an embodiment, where the intermediate layer 220 includes a high-molecular weight material, the intermediate layer 220 may usually have a structure including an HTL and an EML. In such an embodiment, the HTL may include PEDOT, and the EML may include a high-molecular material such as a poly-phenylenevinylene ("PPV")-based polymer or a polyfluorene-based polymer. The structure of the intermediate layer 220 is not limited thereto and may be variously modified. In one embodiment, for example, at least one of layers of the intermediate layer 220 may be integrally formed as a single unitary unit and disposed over multiple pixel electrodes 210. Alternatively, the intermediate layer 220 may include a layer patterned to correspond to each of the pixel electrodes 210.

The opposite electrode 230 may be in an upper portion of the display area DA and may cover the display area DA. That is, the opposite electrode 230 may be integrally formed as a single unitary unit to cover the pixels.

An encapsulation layer 400 may cover the organic light-emitting diode 200 to effectively prevent the organic light-emitting diode 200 from being damaged by external moisture and oxygen. The encapsulation layer 400 may cover the display area DA and may extend to the outside of the display area DA. The encapsulation layer 400 may include an inorganic encapsulation layer and an organic encapsulation layer. FIG. 4 illustrates an embodiment where the encapsulation layer 400 includes a first inorganic encapsulation layer 410, an organic encapsulation layer 420 and a second inorganic encapsulation layer 430.

In such an embodiment, the first inorganic encapsulation layer 410 may cover the opposite electrode 230 and may include SiOx, SiNx, and/or SiON. In such an embodiment, multiple layers including a capping layer 290 may be between the first inorganic encapsulation layer 410 and the opposite electrode 230. Since the first inorganic encapsulation layer 410 is disposed along a structure thereunder, the first inorganic encapsulation layer 410 does not have an even upper surface. The organic encapsulation layer 420 may cover the first inorganic encapsulation layer 410 and may have an approximately even upper surface compared to the first inorganic encapsulation layer 410. In such an embodiment, the organic encapsulation layer 420 may have the approximately even upper surface at a location corresponding to the display area DA. The organic encapsulation layer 420 may include at least one of PET, PEN, polycarbonate, polyimide, polyethylene sulfonate, polyoxymethylene, polyarylate, or hexamethyldisiloxane. The second inorganic encapsulation layer 430 may cover the organic encapsulation layer 420, and may include SiOx, SiNx, and/or SiON.

In the peripheral area PA of FIG. 4, an inorganic insulating layer 110 may be on the substrate 100 and may include at least one of the buffer layer 101, the gate insulating layer 103, the first interlayer insulating layer 105 and/or the second interlayer insulating layer 107 described above. The common power supply line 71 may be on the inorganic insulating layer 110 in the peripheral area PA.

The common power supply line 71 may include the first power supply line layer 71A and the second power supply line layer 71B.

The first power supply line layer 71A and the second power supply line layer 71B may be in different layers with the first organic insulating layer 111 therebetween. The common power supply line 71 may be on the first organic insulating layer 111, and the second power supply line layer 71B may be under the first organic insulating layer 111. The first power supply line layer 71A may include a same material as the second driving voltage line PL2, and the second power supply line layer 71B may include a same material as the data line DL and the first driving voltage line PL1.

A side surface of the second power supply line layer 71B may be covered by an inorganic insulating layer 109. The inorganic insulating layer 109 may effectively prevent the second power supply line layer 71B from being exposed to an etching environment during a manufacturing process, since the second power supply line layer 71B includes a metal, e.g., Al, which may be damaged by an etchant during the manufacture of a display device. Although not illustrated in FIG. 4, in the peripheral area PA other than the areas illustrated in FIG. 4, the second power supply line layer 71B may be exposed without being covered by the first organic insulating layer 111, and the exposed second power supply line layer 71B may be damaged from at a side surface thereof by an etchant used during a process after the second power supply line layer 71B is formed. In an embodiment, the inorganic insulating layer 109 may cover the side surfaces of the second power supply line layer 71B to protect the second power supply line layer 71B.

A first portion of the first power supply line layer 71A may contact (e.g., directly contact) the second power supply line layer 71B via an opening 111OP in the first organic insulating layer 111. A second portion of the first power supply line layer 71A may be on the first organic insulating layer 111 and may overlap a drive circuit, e.g., the first scan drive circuit 20 including a peripheral thin film transistor TFT-P and a line (lines) connected thereto. Since the first scan drive circuit 20 is covered by the second portion of the first power supply line layer 71A, damage to the first scan drive circuit 20 by external static electricity ("ESD") may be effectively prevented.

First holes 71A-h may be defined in the second portion of the first power supply line layer 71A, which overlaps the first scan drive circuit 20. The first hole 71A-h may correspond to an out-gassing path, through which a gas component included in the first organic insulating layer 111 is vaporized during a thermal process (e.g., a curing process) or after the display device 1 is formed. Therefore, damage to the organic light-emitting diode 200 of the pixel P, which may be caused as a gas component in the first organic insulating layer 111 moves toward the pixel P, may be prevented by providing first holes 71A-h in the second portion of the first power supply line layer 71A.

A part of the second portion of the first power supply line layer 71A may be in a first valley hole 111VH defined in the first organic insulating layer 111. In such an embodiment, where the first valley hole 111VH is defined in the first organic insulating layer 111, a penetration path through which external impurities (e.g., moisture) move towards the display area DA may be blocked due to bulk of the first organic insulating layer 111. A portion of the first power supply line layer 71A, which is in the first valley hole 111VH, may contact the inorganic insulating layer 109 under the first organic insulating layer 111, through the first valley hole 111VH.

The connection electrode layer 72 may be on the second organic insulating layer 113. The connection electrode layer 72 may include a same material as the pixel electrode 210. In an embodiment, the connection electrode layer 72 and the pixel electrode 210 may include indium tin oxide ("ITO")/silver (Ag)/ITO.

A first portion of the connection electrode layer 72 may contact (e.g., directly contact) the first power supply line layer 71A through an opening 113OP in the second organic insulating layer 113. A second portion of the connection electrode layer 72 may be on the second organic insulating layer 113 and may overlap the first scan drive circuit 20 and the second portion of the first power supply line layer 71A. In such an embodiment, since both the first power supply line layer 71A and the connection electrode layer 72 cover the first scan drive circuit 20, damage to the first scan drive circuit 20 by ESD may be effectively prevented.

Second holes 72h are defined in the second portion of the connection electrode layer 72. The second hole 72h may correspond to an out-gassing path through which a gas component in the second organic insulating layer 113 is vaporized during a thermal process (e.g., a curing process) or after the display device 1 is formed. Therefore, a in such an embodiment, damage to the organic light-emitting diode 200 of the pixel P, which may be caused as a gas component in the second organic insulating layer 113 moves towards the pixel P, may be effectively prevented by providing the second holes 72h. The second holes 72h of the connection electrode layer 72 may overlap the first holes 71A-h of the first power supply line layer 71A.

A second valley hole 113VH is defined in the second organic insulating layer 113 under the connection electrode layer 72 to correspond to the first valley hole 111VH. Herein, it will be understood that when a component is referred to as "corresponding to" another component, the component may overlap the other component in the z direction. The second valley hole 113VH may block the penetration path, through which external impurities (e.g., moisture, etc.) move towards the display area DA, due to the bulk of the second organic insulating layer 113. A part of the second portion of the connection electrode layer 72 may contact (e.g., directly contact) the first power supply line layer 71A through the second valley hole 113VH in the second organic insulating layer 113.

Another part of the second portion of the connection electrode layer 72 may contact (e.g., directly contact) the second portion of the first power supply line layer 71A through a contact hole 113CH defined in the second organic insulating layer 113. The center of the contact hole 113CH in the second organic insulating layer 113 may be offset from (may be spaced apart by a certain distance from) the center of the first hole 71A-h in the first power supply line layer 71A.

The connection electrode layer 72 may be covered by an insulating layer, e.g., the pixel-defining layer 120. In an embodiment, where the pixel-defining layer 120 is provided by patterning an insulating material layer, portions of the insulating material layer which correspond to at least some of the second holes 72h may be patterned into islands corresponding to the second holes 72h, thereby forming the protrusions 125. The opposite electrode 230 of the organic light-emitting diode 200 may contact the connection electrode layer 72 exposed between the protrusions 125.

The opposite electrode 230 extends to cover at least some of the protrusions 125 across a dummy pixel DPX, and may contact the connection electrode layer 72. In one embodiment, for example, the opposite electrode 230 may contact the connection electrode layer 72 connected to the first power supply line layer 71A through the contact hole 113CH, and may contact the connection electrode layer 72 connected to the first power supply line layer 71A through the second valley hole 113VH.

According to the embodiments described above, a contact area between the connection electrode layer 72 and the first power supply line layer 71A and a contact area between the connection electrode layer 72 and the opposite electrode 230 may increase, and a drop of the common voltage ELVSS supplied to the opposite electrode 230 may be effectively prevented or substantially reduced, such that power consumption of the display device 1 may be improved. Since the connection of the first power supply line layer 71A, the connection electrode layer 72 and the opposite electrode 230 to each other is made in a position right above the first scan drive circuit 20, power consumption may be improved, and the first scan drive circuit 20 may be protected from static electricity, as described above.

Referring to FIGS. 4 and 5A, the protrusions 125 on the connection electrode layer 72 may cover the second holes 72h. The protrusions 125 may have sizes greater than those of the second holes 72h, and as illustrated in FIG. 4, the protrusions 125 may cover hole edges 72he that surround corresponding second holes 72h. Since the hole edges 72he of the connection electrode layer 72 are covered by an insulating material, precipitation of Ag, black spots generated by Ag, etc., which may occur during the manufacture of the display device when the hole edges 72he are exposed, may be effectively prevented.

The protrusions 125 may be arranged in a zigzag manner. In one embodiment, for example, as illustrated in FIG. 5A, the protrusions 125 may be arranged in a zigzag manner in which neighboring protrusions 125 that are apart from one another in a y direction, and another protrusion 125 that is apart in an x direction from the neighboring protrusions 125 is between the protrusions 125.

The protrusions 125 arranged in a zigzag manner may control flow of a material for forming the organic encapsulation layer 420 during a formation process of the organic encapsulation layer 420 of the encapsulation layer 400. During the formation process of the organic encapsulation layer 420, an organic material for forming the organic encapsulation layer 420 may have fluidity and may flow towards the edges of the substrate 100, that is, in the x direction. When the organic material for forming the organic encapsulation layer 420 flows towards the edges of the substrate 100, the protrusions 125 arranged in a zigzag manner may disturb the flow of the organic material and thus may control a location of an end of the organic material, that is, an end of the organic encapsulation layer 420, in the display device. The arrow of FIG. 5B indicates flow of the material for forming the organic encapsulation layer 420.

The organic encapsulation layer 420, which is formed by controlling the flow of the organic material by the protrusions 125, may cover at least some of the protrusions 125. In one embodiment, for example, as illustrated in FIG. 4, the end of the organic encapsulation layer 420 may be above the protrusions 125. The location of the end of the organic encapsulation layer 420 may differ, depending on a type of the organic material, arrangements of the protrusions 125, densities of the protrusions 125, or the like. In one embodiment, for example, the end of the organic encapsulation layer 420 may correspond to an inner wall of a first dam 340 to be described below.

In an embodiment, as shown in FIG. 4, the first dam 340 and a second dam 350 may be on outer sides of the protrusions 125 and the edges of the substrate 100. The first dam 340 and the second dam 350 may effectively prevent the organic material from flowing into the end of the substrate 100 when the organic encapsulation layer 420 is formed, and thus the first dam 340 and the second dam 350 may effectively prevent formation of an edge tail of the organic encapsulation layer 420. FIG. 4 illustrates an embodiment where the first dam 340 is on the common power supply line 71 and the second dam 350 is outer than the first dam 340.

In an embodiment, the first dam 340 may include a first layer 341 and a second layer 342. The first layer 341 may include a same material as the second organic insulating layer 113, and the second layer 342 may include a same material as the pixel-defining layer 120. The second dam 350 may include a first layer 351 including a same material as the first organic insulating layer 111, a second layer 352 including a same material as the second organic insulating layer 113, and a third layer 353 including a same material as the pixel-defining layer 120. FIG. 4 illustrates an embodiment where the first dam 340 includes two layers and the second dam 350 includes three layers, but one or more embodiments of the disclosure are not limited thereto. The first dam 340 and the second dam 350 may surround the entire display area DA to effectively prevent the formation of the edge tail of the organic encapsulation layer 420.

Figure 6:
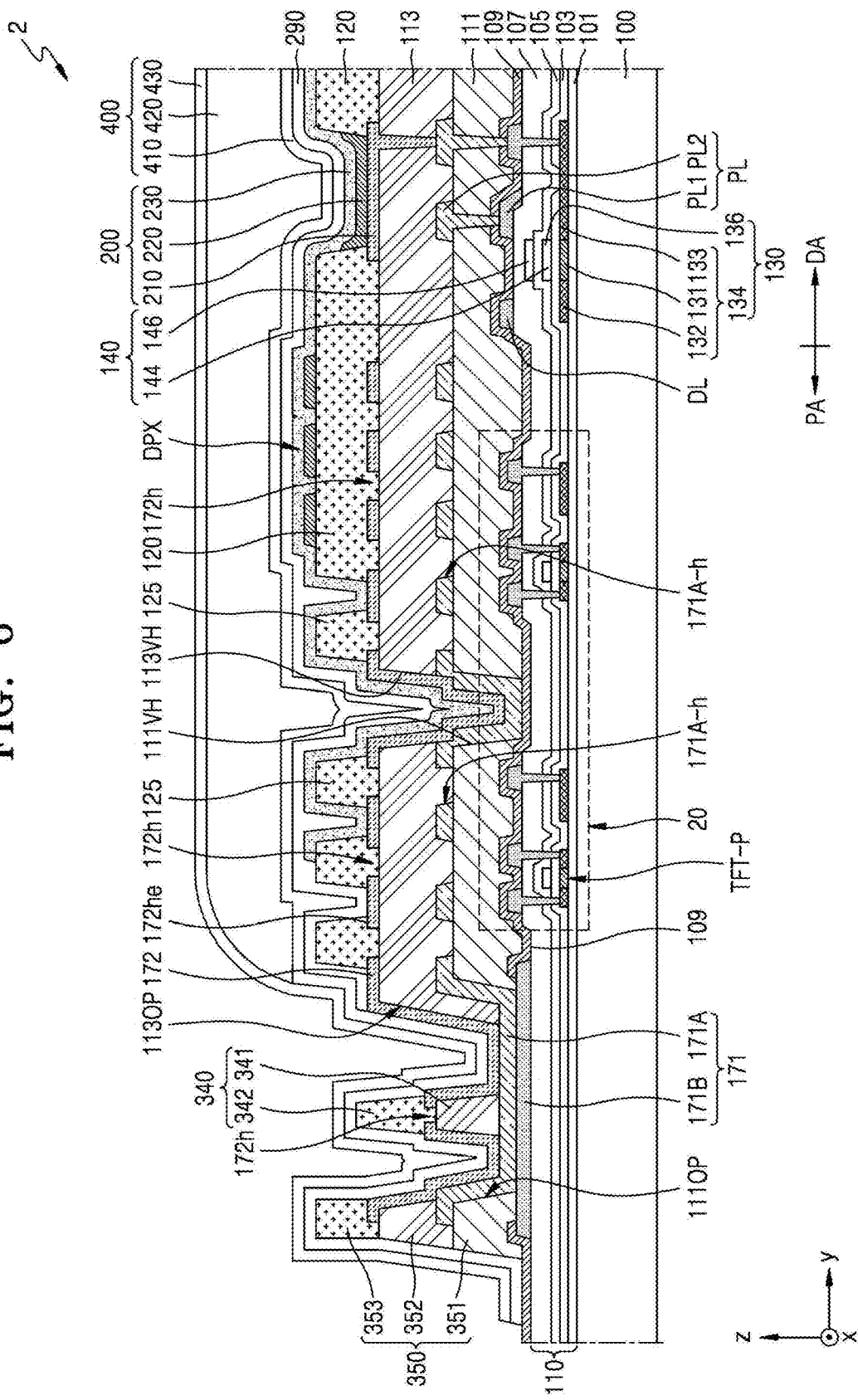
FIG. 6 is a cross-sectional view of a display device according to an alternative embodiment.

FIG. 6 is a cross-sectional view of a display device 2 according to an alternative embodiment.

In an embodiment, as shown in FIG. 6, the display device 2 includes a power supply line 171 and a connection electrode layer 172 electrically connecting the power supply line 171 to the opposite electrode 230, and the power supply line 171 includes a first power supply line layer 171A on the first organic insulating layer 111, where first holes 171A-h are defined in the first power supply line layer 171A, and a second power supply line layer 171B. The display device 2 of FIG. 6 is substantially the same the display device of FIGS. 4 and 5 except for a configuration of the connection electrode layer 172. The same or like elements shown in FIG. 6 have been labeled with the same reference characters as used above to describe the exemplary embodiments of the display device shown in FIGS. 4 and 5, and any repetitive detailed description thereof will hereinafter be omitted or simplified.

In an embodiment, as shown in FIG. 6, the connection electrode layer 172 is on the second organic insulating layer 113. A first portion of the connection electrode layer 172 may contact a first area of the first power supply line layer 171A through the opening 1130P, and a part of a second portion of the connection electrode layer 172 may contact the first power supply line layer 171A through the second valley hole 113VH in the second organic insulating layer 113. In an embodiment, as shown in FIG. 4, the second portion of the connection electrode layer 72 contacts the second portion of the first power supply line layer 71A through the contact hole. In an alternative embodiment, as shown in FIG. 6, the second portion of the connection electrode layer 172 may contact the first power supply line layer 171A only through the second valley hole 113VH.

The protrusions 125 are on the connection electrode layer 172 to be greater than second holes 172h and cover hole edges 172he, and the protrusions 125 controls the flow of the organic encapsulation layer 420 as described above with reference to FIG. 4. Thus, any repetitive detailed description thereof will be omitted.

Figure 7:
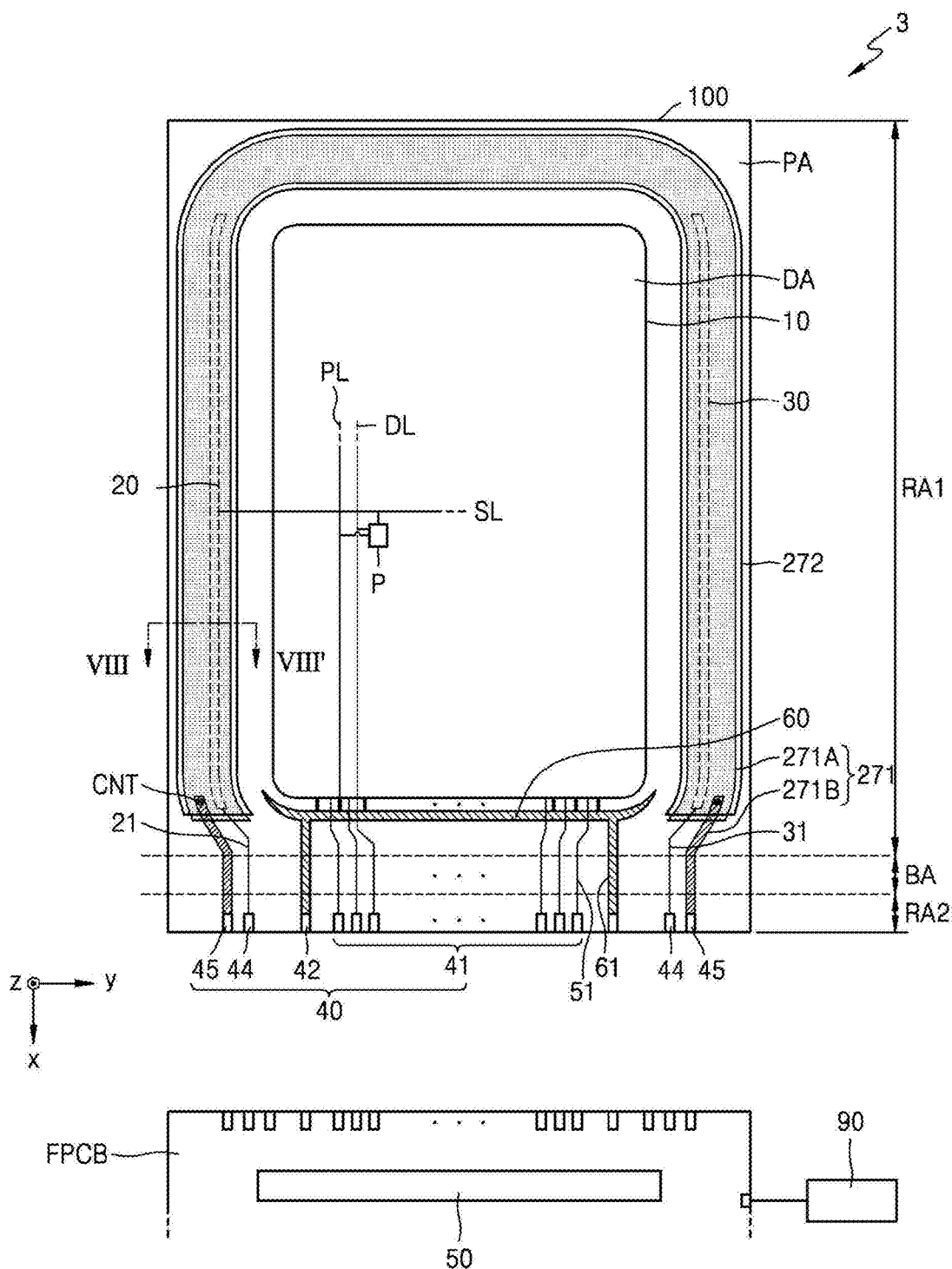
FIG. 7 is a plan view of a display device according to another embodiment.

FIG. 7 is a plan view of a display device 3 according to another alternative embodiment.

In an embodiment, as shown in FIG. 7, the display device 3 includes a power supply line 271 and a connection electrode layer 272, and the power supply line 271 includes a first power supply line layer 271A and a second power supply line layer 271B. The display device of FIG. 7 is substantially the same as the display device 1 of FIGS. 1 to 3 except for configurations of the first power supply line layer 271A and the second power supply line layer 271B. The same or like elements shown in FIG. 7 have been labeled with the same reference characters as used above to describe the exemplary embodiments of the display device shown in FIGS. 1 to 3, and any repetitive detailed description thereof will hereinafter be omitted or simplified.

In an embodiment, as shown in FIG. 7, the first power supply line layer 271A of the display device 3 may extend to partially surround the display 10 along the edges of the display 10. In one embodiment, for example, the first power supply line layer 271A may be loop-shaped with one open side corresponding to a side of the display 10, which is adjacent to the terminal portion 40, and may extend along the edges of the substrate 100 except for the terminal portion 40. The first power supply line layer 271A may be in the first area RA1 where the display 10 is disposed, from among the areas of the peripheral area PA.

The second power supply line layer 271B may overlap and contact the first power supply line layer 271A. In such an embodiment, as shown in FIG. 7, the second power supply line layer 271B does not surround the display 10. The second power supply line layer 271B may be in one side of the peripheral area PA, e.g., the second area RA2, the bending area BA and a portion of the first area RA1, to connect the terminal portion 40 to an end of the first power supply line layer 271A. The second power supply line layer 271B may contact the end of the first power supply line layer 271A through a contact hole CNT in an insulating layer between the second power supply line layer 271B and the first power supply line layer 271A.

In an embodiment where the display device 3 includes the bending area BA, the second power supply line layer 271B may include the bridge line layer passing the bending area BA as described above. In an alternative embodiment, the display device 3 may not include the bending area BA, and the second power supply line layer 271B may not include the bridge line layer.

In an embodiment, as shown in FIG. 7, the connection electrode layer 272 may extend to partially surround the display 10 along the first power supply line layer 271A to overlap the first power supply line layer 271A. A portion of the connection electrode layer 272, which overlaps the first power supply line layer 271A, may correspond to an area, for example, a contact area, where the connection electrode layer 272 is electrically connected to the first power supply line layer 271A. The connection electrode layer 272 may electrically connect the common power supply line 71 to the opposite electrode (e.g., the cathode) of the organic light-emitting diode of the pixel P.

FIG. 7 illustrates an embodiment where a width of the connection electrode layer 272 is greater than that of the first power supply line layer 271A, but one or more embodiments of the disclosure are not limited thereto. In an alternative embodiment, the width of the connection electrode layer 272 may be substantially the same as or less than that of the first power supply line layer 271A.

Figure 8:
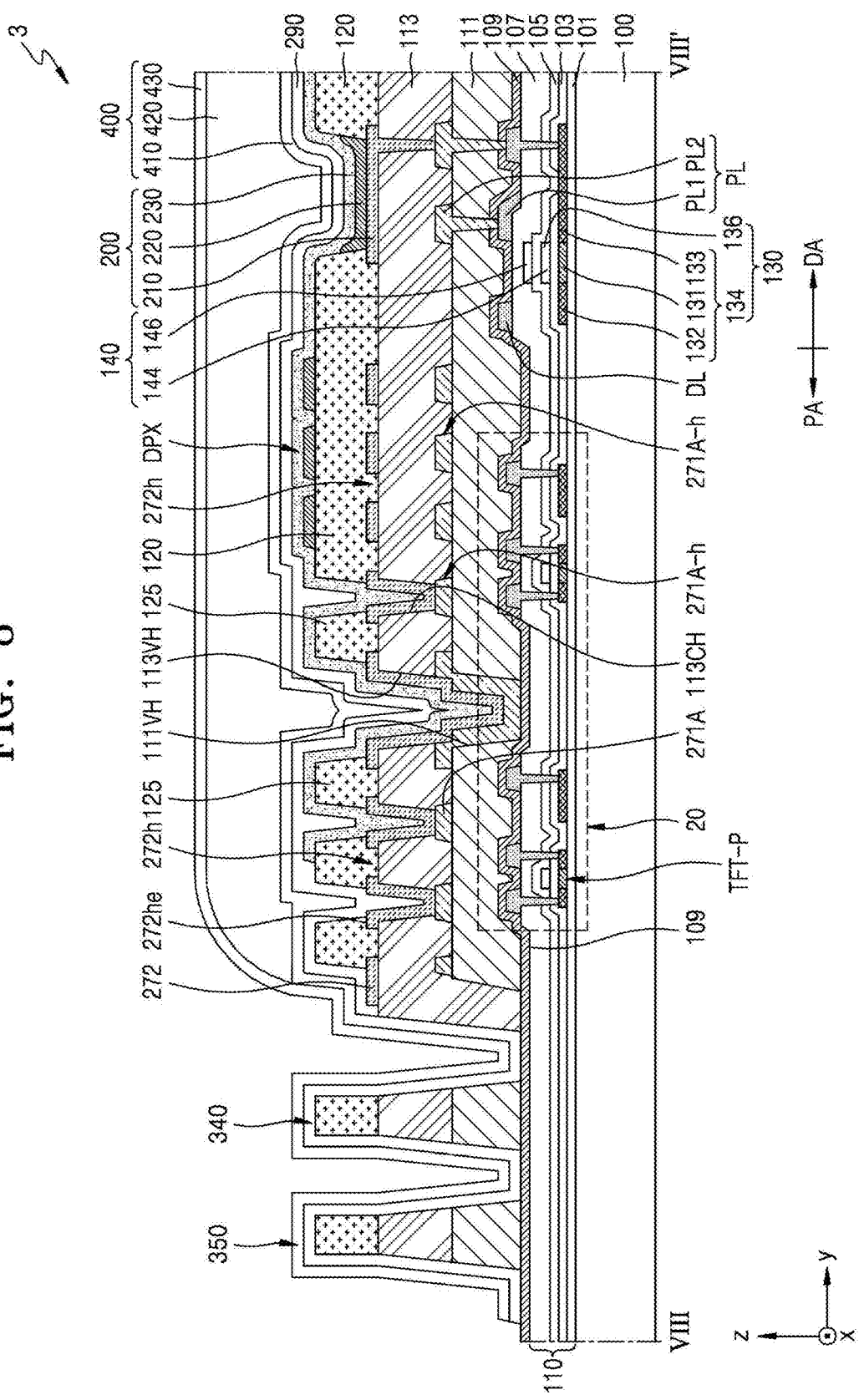
FIG. 8 is a cross-sectional view taken along line VIII-VIII' of FIG. 7.

FIG. 8 is a cross-sectional view taken along line VIII-VIII' of FIG. 7.

Referring to FIG. 8, the display device 3 is substantially the same as the display device 1 of FIG. 4 except for the peripheral area PA. The same or like elements shown in FIG. 8 have been labeled with the same reference characters as used above to describe the exemplary embodiments of the display device 1 shown in FIG. 1, and any repetitive detailed description thereof will hereinafter be omitted or simplified.

Referring to the peripheral area PA of FIG. 8, the first organic insulating layer 111 is on the first scan drive circuit 20 including a peripheral thin film transistor TFT-P, and the first power supply line layer 271A is on the first organic insulating layer 111.

The first power supply line layer 271A may be on the first organic insulating layer 111 and may overlap the first scan drive circuit 20, thus effectively preventing the damage to the first scan drive circuit 20 by ESD.

A portion of the first power supply line layer 271A may be in the first valley hole 111VH in the first organic insulating layer 111, and may contact the inorganic insulating layer 109 under the first organic insulating layer 111 through the first valley hole 111VH. Another portion of the first power supply line layer 271A includes first holes 271A-h. In such an embodiment, as described above, the first hole 271A-h may correspond to an out-gassing path through which impurities included in the first organic insulating layer 111 may be discharged.

The second organic insulating layer 113 may be on the first power supply line layer 271A. The second valley hole 113VH is defined through the second organic insulating layer 113 to correspond to the first valley hole 111VH, and a portion of the connection electrode layer 272 may contact the first power supply line layer 271A through the second valley hole 113VH. In such an embodiment, as described above, similar to the first valley hole 111VH, the second valley hole 113VH may block the penetration path through which external impurities (e.g., moisture, etc.) move towards the display area DA, due to the bulk of the second organic insulating layer 113.

The contact hole 113CH, through which the first power supply line layer 271A is exposed, is defined in the second organic insulating layer 113, and the connection electrode layer 272 may contact the first power supply line layer 271A exposed through the contact hole 113CH. The center of the contact hole 113CH in the second organic insulating layer 113 may be offset from the center of the first hole 271A-h in the first power supply line layer 271A.

The connection electrode layer 272 may be covered by an insulating layer, e.g., an insulating material layer forming the pixel-defining layer 120, and when the insulating material layer for forming the pixel-defining layer 120 is patterned, a portion of the insulating material layer which corresponds to the second hole 272h defined in the connection electrode layer 272 may be patterned into an island such that the protrusions 125 may be formed. The protrusions 125 may have sizes greater than those of the second holes 272h, and as illustrated in FIG. 7, the protrusions 125 may cover hole edges 272he that surround corresponding second holes 272h. In such an embodiment, as described above with reference to FIG. 5B, the flow of the organic encapsulation layer 420 may be controlled by the protrusions 125 in the zigzag arrangement.

The opposite electrode 230 of the organic light-emitting diode 200 may extend to the peripheral area PA across the dummy pixel DPX, and may contact the connection electrode layer 72 exposed between the protrusions 125.

The first power supply line layer 271A and the connection electrode layer 272 may be right above the first scan drive circuit 20 and thus may protect the first scan drive circuit 20 from ESD. In such an embodiment, the first power supply line layer 271A and the connection electrode layer 272 may contact the opposite electrode 230 above the first scan drive circuit 20, and may reduce resistance such that a drop of the common voltage ELVSS supplied to the opposite electrode 230 may be effectively prevented or substantially reduced, or power consumed by the display device 3 may decrease.

In an embodiment of the display device 3, as shown in FIG. 8, the power supply line 271 and the connection electrode layer 272 may not extend to the bottoms of the first and second dams 340 and 350 and may be in an area overlapping the first scan drive circuit 20, thereby decreasing a width of the peripheral area PA of the display device 3.

Figure 9:
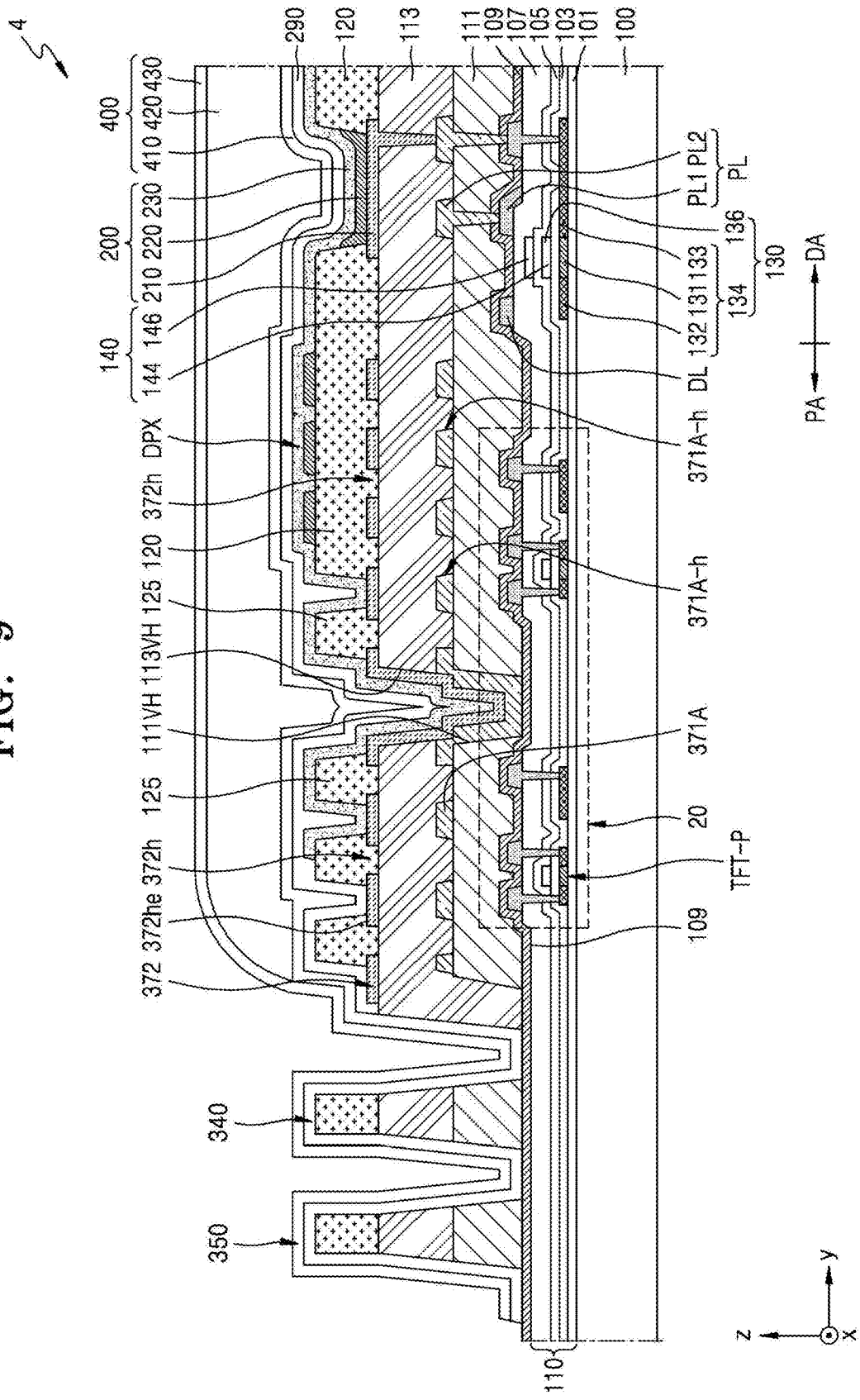
FIG. 9 is a cross-sectional view of a display device according to another alternative embodiment.

FIG. 9 is a cross-sectional view of a display device 4 according to another alternative embodiment.

In such an embodiment, as shown in FIG. 9 and as described above with reference to FIG. 8, the display device 4 includes a power supply line and a connection electrode layer 372 electrically connecting the opposite electrode 230 to the power supply line, and the power supply line 371 includes a first power supply line layer 371A and a second power supply line layer (not illustrated). Although not illustrated in FIG. 9, the second power supply line layer of the power supply line may be partially in the peripheral area PA, as described above with reference to FIG. 7 and may contact the first power supply line layer 371A through the contact hole CNT (refer to FIG. 7), as described above.

The first power supply line layer 371A may be on the first organic insulating layer 111 and first holes 371A-h are defined in the first power supply line layer 371A. The display device 4 of FIG. 9 is substantially the same as the display device of FIG. 8 except for a configuration of the connection electrode layer 372. The same or like elements shown in FIG. 9 have been labeled with the same reference characters as used above to describe the exemplary embodiments of the display device 3 shown in FIG. 8, and any repetitive detailed description thereof will hereinafter be omitted or simplified.

The connection electrode layer 372 may be on the second organic insulating layer 113, and may contact the first power supply line layer 371A through the second valley hole 113VH in the second organic insulating layer 113. In an embodiment, as shown in 8, the connection electrode layer 272 contacts the first power supply line layer 271A through the contact hole 113CH. In an alternative embodiment, as shown in FIG. 9, the contact hole 113CH for connecting the connection electrode layer 272 to the first power supply line layer 271A is not defined in the second organic insulating layer 113.

In such an embodiment, the protrusions 125 are formed on the connection electrode layer 372 to be greater than second holes 372h to thus cover hole edges 372he, and the flow of the organic encapsulation layer 420 may be controlled by the protrusions 125, as described above with reference to FIGS. 4 and 5. Thus, any repetitive detailed description thereof will be omitted.

According to the one or more embodiments set forth herein, as described above, a display device has improved power consumption and reduced dead area, e.g., a peripheral area.

The invention should not be construed as being limited to the embodiments set forth herein. Rather, these embodiments are provided so that this disclosure will be thorough and complete and will fully convey the concept of the present invention to those skilled in the art.

While the invention has been particularly shown and described with reference to embodiments thereof, it will be understood by those of ordinary skill in the art that various changes in form and details may be made therein without departing from the spirit and scope of the invention as defined by the following claims.

What is claimed is:

1. A display device comprising:
   a substrate;
   a plurality of display elements in a display area of the substrate, wherein each of the plurality of display elements includes a pixel electrode, an opposite electrode, and an intermediate layer between the pixel electrode and the opposite electrode;
   a drive circuit on an outer side of the display area and including a thin film transistor;
   a first insulating layer on the drive circuit;
   a first power supply line layer on the first insulating layer and overlapping the drive circuit;
   a second insulating layer on the first power supply line layer; and
   a connection electrode layer on the second insulating layer, wherein the connection electrode layer electrically connects the first power supply line layer to the opposite electrode.

2. The display device of claim 1, wherein a plurality of first holes is defined in the first power supply line layer.

3. The display device of claim 2, wherein
   a contact hole is defined in the second insulating layer, and
   a center of the contact hole is offset from a center of each of the plurality of first holes.

4. The display device of claim 3, wherein the connection electrode layer contacts the first power supply line layer through the contact hole.

5. The display device of claim 2, wherein a plurality of second holes is defined in the connection electrode layer.

6. The display device of claim 5, wherein at least one of the plurality of second holes overlap at least one of the plurality of first holes.

7. The display device of claim 5, further comprising:
   a plurality of protrusions covering the plurality of second holes, respectively,
   wherein the plurality of protrusions includes an insulating material.

8. The display device of claim 7, wherein the plurality of protrusions is spaced apart from one another.

9. The display device of claim 1, wherein a first valley hole is defined in the first insulating layer.

10. The display device of claim 9, wherein the first insulating layer comprises an organic insulating material.

11. The display device of claim 9, wherein a portion of the first power supply line layer contacts, through the first valley hole, an insulating layer under the first insulating layer.

12. The display device of claim 11, wherein the insulating layer comprises an inorganic material.

13. The display device of claim 10, wherein
   a second valley hole corresponding to the first valley hole is defined in the second insulating layer, and
   the connection electrode layer contacts the first power supply line layer through the second valley hole.

14. The display device of claim 13, wherein the second insulating layer comprises an organic insulating material.

15. The display device of claim 1, further comprising:
a second power supply line layer on the outer side of the display area and connected to the first power supply line layer.

16. The display device of claim 15, wherein the first power supply line layer and the second power supply line layer partially surround the display area.

17. The display device of claim 16, wherein a contact area between the first power supply line layer and the second power supply line layer extends to partially surround the display area.

18. The display device of claim 15, wherein
the first power supply line layer partially surrounds the display area, and
the second power supply line layer contacts the first power supply line layer on the outer side of the display area.

19. The display device of claim 15, wherein
the second power supply line layer is under the first insulating layer, and
the first power supply line layer contacts the second power supply line layer through an opening or a contact hole, which is defined in the first insulating layer.

20. The display device of claim 15, wherein a side surface of the second power supply line layer is covered by an inorganic insulating layer.

* * * * *